(12) United States Patent
Sekine et al.

(10) Patent No.: US 7,592,885 B2
(45) Date of Patent: Sep. 22, 2009

(54) STACKED DIELECTRIC BAND-PASS FILTER HAVING A WIDER PASSBAND

(75) Inventors: Hideyuki Sekine, Gunma (JP); Takeshi Kosaka, Gunma (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 13 days.

(21) Appl. No.: 11/871,350

(22) Filed: Oct. 12, 2007

(65) Prior Publication Data
US 2008/0116998 A1    May 22, 2008

(30) Foreign Application Priority Data
Oct. 13, 2006 (JP) ............................. 2006-279568

(51) Int. Cl.
*H01P 1/203* (2006.01)
(52) U.S. Cl. ..................... 333/204; 333/205
(58) Field of Classification Search ................ 333/175, 333/176, 185, 202, 203, 204, 205, 238, 219, 333/246
See application file for complete search history.

(56) References Cited

U.S. PATENT DOCUMENTS

| | | | | |
|---|---|---|---|---|
| 5,576,672 A | * | 11/1996 | Hirai et al. | 333/204 |
| 5,608,364 A | * | 3/1997 | Hirai et al. | 333/204 |
| 6,140,891 A | * | 10/2000 | Nakakubo et al. | 333/204 |
| 6,529,096 B2 | * | 3/2003 | Maekawa et al. | 333/134 |
| 6,603,372 B1 | * | 8/2003 | Ishizaki et al. | 333/204 |
| 7,355,494 B2 | * | 4/2008 | Kosaka | 333/204 |

FOREIGN PATENT DOCUMENTS

JP          2006-101500          1/2006

* cited by examiner

*Primary Examiner*—Robert Pascal
*Assistant Examiner*—Kimberly E Glenn
(74) *Attorney, Agent, or Firm*—Knobbe Martens Olson & Bear LLP

(57) ABSTRACT

A stacked dielectric band-pass filter is disclosed, which enables widening of a passband to a side of a high band of 8 GHz or more. Within a stacked dielectric block, a pair of first $\lambda/4$ resonator electrodes that are formed on approximately the same plane, and connected to input terminals or output terminals via lead conductors respectively, two capacitance electrodes that are opposed to the first $\lambda/4$ resonator electrodes via a dielectric respectively, and formed on approximately the same plane, a $\lambda/2$ resonator electrode for connecting the capacitance electrodes to each other, and a pair of second $\lambda/4$ resonator electrodes that are opposed to the capacitance electrodes via a dielectric respectively, and formed on approximately the same plane, are buried.

7 Claims, 5 Drawing Sheets

PRIOR ART

STACKED DIELECTRIC BAND-PASS FILTER HAVING A WIDER PASSBAND

BACKGROUND OF THE INVENTION

1. Field of the Invention

The present invention relates to a stacked dielectric band-pass filter that enables a passband to be wider than ever before.

2. Description of the Related Technology

In a high frequency circuit section of a radio communication device or the like, a band-pass filter is used for attenuating an unnecessary component such as harmonic waves. As this type of band-pass filter, a filter using a dielectric resonator, which is small and provides a good attenuation characteristic, is currently mainstream. In particular, as a resonator formed in a dielectric, a distributed constant filter using a strip line is widely used.

Recently, as seen in a UWB (Ultra Wide Band) system, a filter is required to be usable for a wide band in which a specific bandwidth (passband with/central frequency) is approximately 100% or more.

In a usual design method of a band-pass filter, the resonator was necessary to be multi-stepped to widen a passband. However, when the number of steps of the resonator is increased in this way, another difficulty occurs along with this, that is, increase in size and increase in insertion loss occur. In particular, when an ultra wide band as in the UWB system is achieved, since a resonator having only two to three steps cannot provide a necessary bandwidth, a filter that is small and low in loss has been hardly provided in the usual method.

Thus, as shown in JP-A-2006-101500, as a filter being effective for achieving a wider bandwidth while meeting the requirements of small size and low loss, a filter is proposed, which uses a fundamental band of a $\lambda$ wave given by a $\lambda/4$ resonator, a third harmonic wave of the $\lambda$ wave shifted to a lower band side, and a passband given by a $\lambda/2$ resonator for interpolation between the fundamental wave and the third harmonic wave, and thereby provides a flat pass characteristic in a bandwidth from the fundamental wave to the third harmonic wave.

To achieve a further wide band in such a filter, it is considered that the fundamental wave is shifted to a lower band side to widen a low frequency band, and a shift level of the third harmonic wave is reduced to widen a band at a higher band side. However, this makes it difficult to perform interpolation between the fundamental wave and the third harmonic wave using the passband given by the $\lambda/2$ resonator, as a result, a region being insufficiently interpolated may be formed. Consequently, there has been a problem that the flat pass characteristic can be currently obtained only in a band from 3 to 8 GHz.

SUMMARY OF CERTAIN INVENTIVE ASPECTS

Certain inventive aspects relate to a band-pass filter that enables widening of a passband to a side of a higher band than bands of a fundamental wave and a third harmonic wave.

A first inventive aspect relates to a stacked dielectric band-pass filter having a stacked dielectric block in an approximately rectangular shape, input terminals and output terminals formed on one pair of side faces opposed to each other of the stacked dielectric block, and ground terminals formed on the other pair of side faces opposed to each other of the stacked dielectric block; wherein a pair of first $\lambda/4$ resonator electrodes that are formed on approximately the same plane, and connected to the input terminals or the output terminals via lead conductors respectively, two capacitance electrodes that are opposed to the first $\lambda/4$ resonator electrodes via a dielectric respectively, and formed on approximately the same plane, a $\lambda/2$ resonator electrode for connecting the capacitance electrodes to each other, and a pair of second $\lambda/4$ resonator electrodes that are opposed to the capacitance electrodes via a dielectric respectively, and formed on approximately the same plane, are buried in layers within the stacked dielectric block.

The pair of second $\lambda/4$ resonator electrodes provide magnetic field coupling, thereby a resonance wave is generated at a side of a higher band than bands of a fundamental wave and a third harmonic wave. Therefore, a band-pass filter can be obtained, which enables widening of a passband to the side of the higher band than bands of the fundamental wave and the third harmonic wave.

A second inventive aspect relates to a stacked dielectric band-pass filter, in which at least one ground electrode connected to the ground terminals is buried within the stacked dielectric block, and the ground electrode is formed at a side of a plane being a mounting face with respect to the first $\lambda/4$ resonator electrodes, second $\lambda/4$ resonator electrodes, and $\lambda/2$ resonator electrode. Furthermore, the invention proposes a stacked dielectric band-pass filter, in which two ground electrodes are formed so as to sandwich the first $\lambda/4$ resonator electrodes, second $\lambda/4$ resonator electrodes, and $\lambda/2$ resonator electrode.

Since one ground electrode is formed at the side of the plane being the mounting face with respect to the first $\lambda/4$ resonator electrodes, second $\lambda/4$ resonator electrodes, and $\lambda/2$ resonator electrode, a stacked dielectric band-pass filter having a microstrip line structure can be given. Moreover, since two ground electrodes are formed so as to sandwich the first $\lambda/4$ resonator electrodes, second $\lambda/4$ resonator electrodes, and $\lambda/2$ resonator electrode, a stacked dielectric band-pass filter having a strip line structure can be given.

The stacked dielectric band-pass filter enables widening of a passband to the side of the higher band than bands of the fundamental wave and the third harmonic wave.

DETAILED DESCRIPTION OF CERTAIN INVENTIVE EMBODIMENTS

Certain embodiments of a stacked dielectric band-pass filter will be described according to drawings. The invention is not limited to the following embodiments, and can be appropriately modified or altered.

Figure 1:
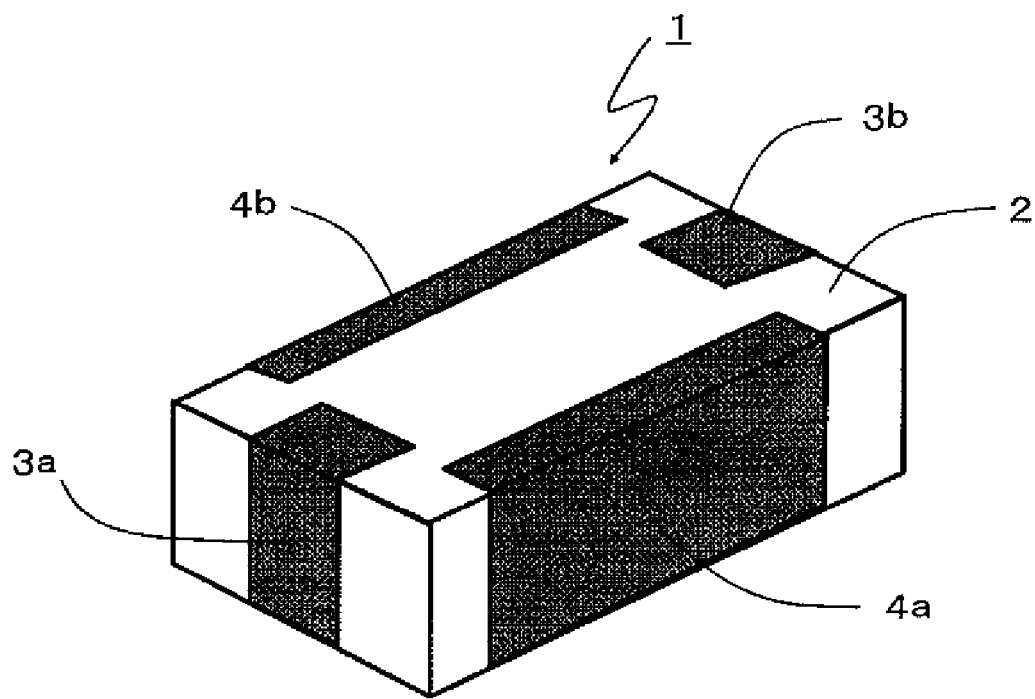
FIG. 1 is a perspective diagram showing appearance of a stacked dielectric band-pass filter of one embodiment.

FIG. 1 is a perspective diagram showing appearance of a stacked dielectric band-pass filter of one embodiment. In the stacked dielectric band-pass filter 1, a stacked dielectric block 2 is provided as a body, and an input terminal 3a is formed on one face of one pair of side faces opposed to each other, and an output terminal 3b is formed on the other face of the pair of the side faces. Ground terminals 4a and 4b are formed on the other pair of side faces opposed to each other.

The stacked dielectric block 2 is, for example, formed of a dielectric material formed in an approximately rectangular shape of about 2.0 mm×1.25 mm. As the dielectric material, high frequency dielectric materials of a barium titanate group such as $Ba_2Ti_9O_{20}$, $BaTi_2O_6$, $BaTi_4O_9$ and $Ba_4Ti_{13}O_{30}$, or glass ceramics using alumina, silica and the like as a filler may be used. An internal conductor configuring a band-pass filter is buried within the stacked dielectric block 2. The input terminal 3a, output terminal 3b, and ground terminals 4a, 4b are formed by coating a conductive paste such as Ag or Cu paste and then baking the paste, and appropriately covering the paste with a plating metal by a method of electroplating or electroless plating.

Figure 2:
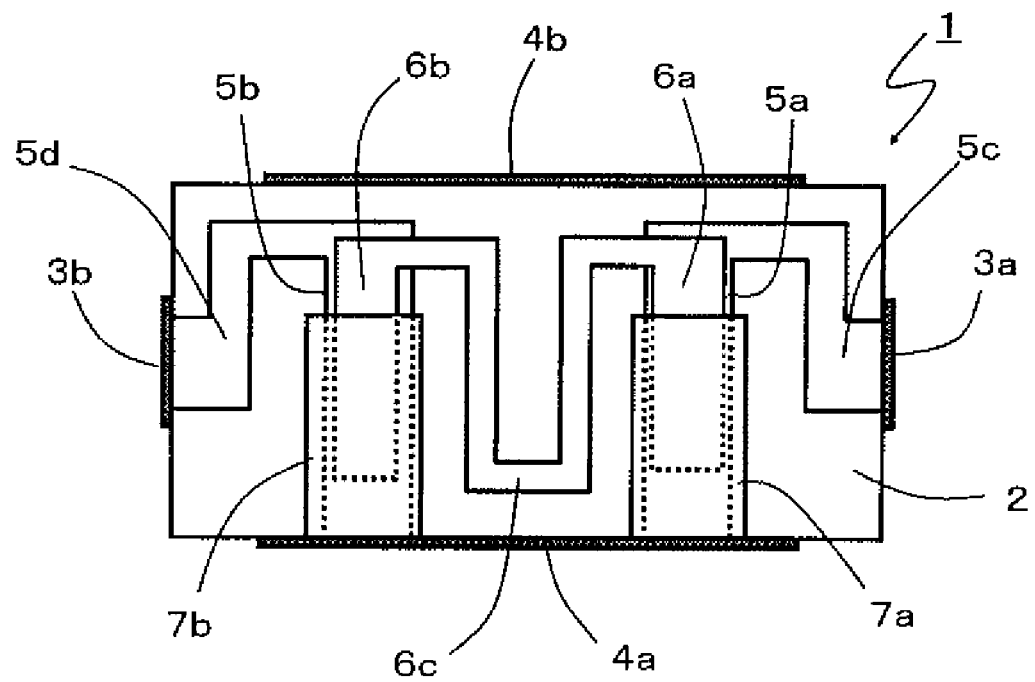
FIG. 2 is a plane perspective diagram of the stacked dielectric band-pass filter of one embodiment.
Figure 3:
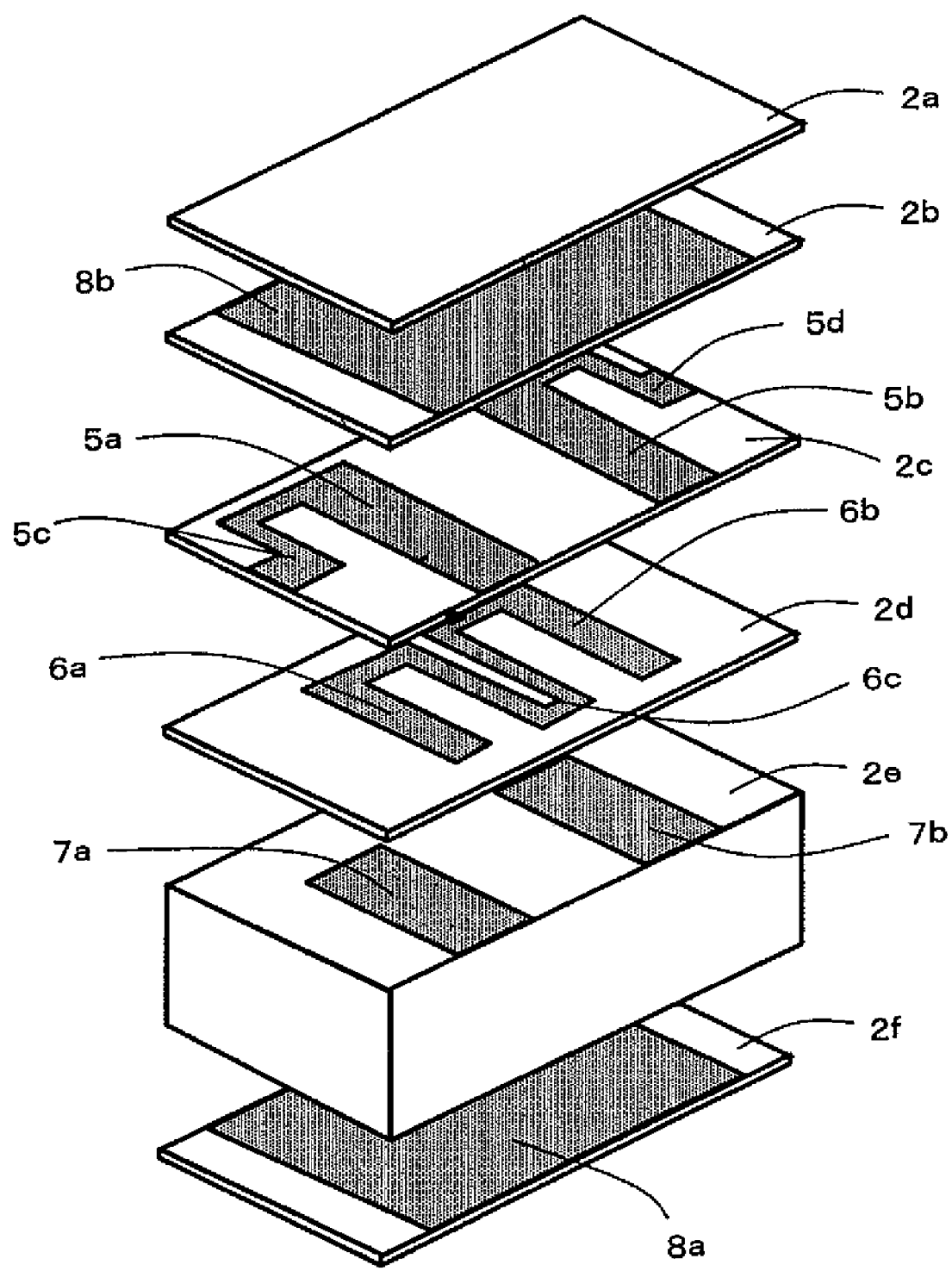
FIG. 3 is an exploded perspective diagram of the stacked dielectric band-pass filter of one embodiment.

Next, the internal conductor configuring the band-pass filter is described. FIG. 2 is a plane perspective diagram of the stacked dielectric band-pass filter of the embodiment seen from a mounting face side, namely, a bottom side of FIG. 1. In FIG. 2, areas other than areas where electrodes are overlapped and thus concealed by each other are shown by solid lines for convenience in order to show an overlapping relationship between the electrodes. FIG. 3 is an exploded perspective diagram of the stacked dielectric band-pass filter of the embodiment. In FIG. 3, the input terminal 3a, output terminal 3b, and ground terminals 4a, 4b are omitted for convenience.

On a plane 2c, a first $\lambda/4$ resonator electrode 5a connected to the input terminal 3a via a lead conductor 5c, and a first $\lambda/4$ resonator electrode 5b connected to the output terminal 3b via a lead conductor 5d are formed in pair. Each of the pair of first $\lambda/4$ resonator electrodes 5a and 5b is connected to the ground terminal at one end. Since part of the lead conductor may act as an inductance component, the part can be used for adjusting a filter characteristic by adjusting length thereof.

On a plane 2d, a capacitance electrode 6a facing the first $\lambda/4$ resonator electrode 5a via a dielectric, a capacitance electrode 6b facing the first $\lambda/4$ resonator electrode 5b via a dielectric, and a $\lambda/2$ resonator electrode 6c for connecting the capacitance electrodes 6a and 6b to each other are formed. According to such a configuration, the first $\lambda/4$ resonator electrodes 5a and 5b can be capacitively coupled with the $\lambda/2$ resonator electrode 6c.

On a plane 2e, a second $\lambda/4$ resonator electrode 7a facing the capacitance electrode 6a via a dielectric, and a second $\lambda/4$ resonator electrode 7b facing the capacitance electrode 6b via a dielectric are formed in pair. Each of the pair of second $\lambda/4$ resonator electrodes 7a and 7b is connected to the ground terminal at one end, and opened at the other end. According to such a configuration, a structure as shown in FIG. 2 is given, in which the capacitance electrode 6a is sandwiched by the first $\lambda/4$ resonator electrode 5a and the second $\lambda/4$ resonator electrode 7a, and the capacitance electrode 6b is sandwiched by the first $\lambda/4$ resonator electrode 5b and the second $\lambda/4$ resonator electrode 7b. Since the second $\lambda/4$ resonator electrodes 7a and 7b do not directly transmit a signal unlike the first $\lambda/4$ resonator electrodes 5a and 5b, magnetic field coupling induced between the second $\lambda/4$ resonator electrodes 7a and 7b is strong compared with capacitive coupling between the second $\lambda/4$ resonator electrodes and the $\lambda/2$ resonator electrode 6c.

A ground electrode 5b is formed on a plane 2b, and a ground electrode 8a is formed on a plane 2f. The ground electrodes 8a and 8b are formed so as to be connected to the ground terminals 4a and 4b. The ground electrodes 8a and 8b are used to sandwich the internal conductor configuring the band-pass filter, thereby a stacked dielectric band-pass filter having a strip line structure can be configured. In the ground electrodes 8a and 8b, the ground electrode 5b may be omitted while the ground electrode 8a at a mounting face side is left. In this case, a stacked dielectric band-pass filter having a microstrip line structure can be configured.

The internal conductor configuring the band-pass filter is desirably disposed such that it is localized so as to be separated from the ground electrode 8a at the mounting face side. Thus, a third harmonic wave can be shifted to a lower band side.

Figure 4:
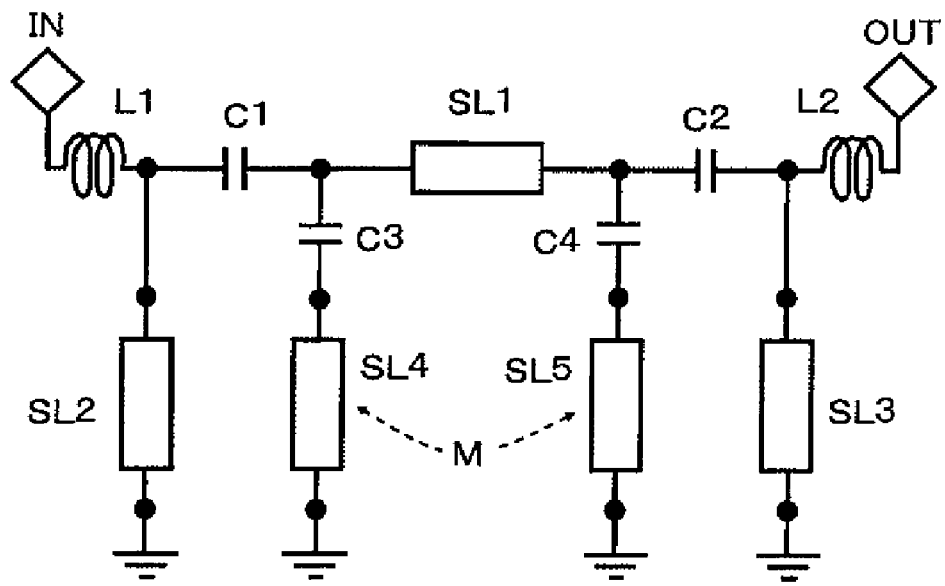
FIG. 4 is an equivalent circuit diagram of the stacked dielectric band-pass filter of one embodiment.
Figure 5:
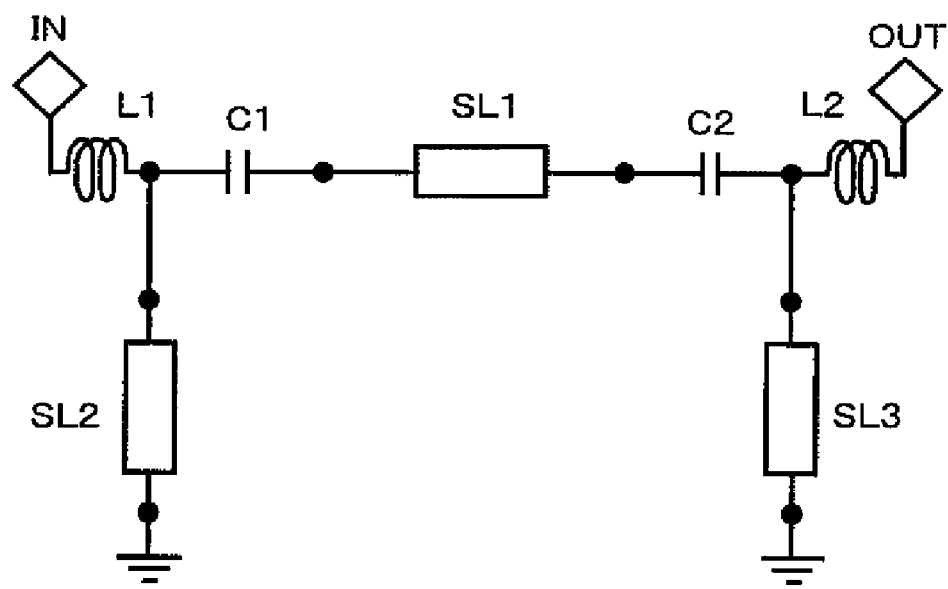
FIG. 5 is an equivalent circuit diagram of a usual stacked dielectric band-pass filter.
Figure 6:
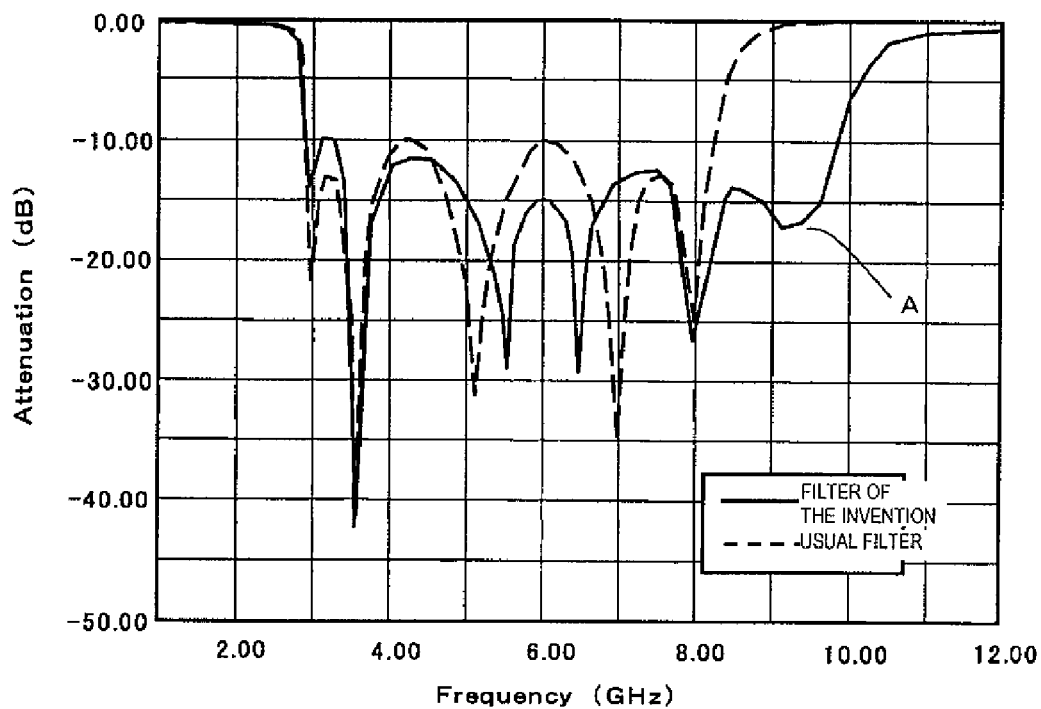
FIG. 6 is a graph showing reflection characteristics of the stacked dielectric band-pass filters.
Figure 7:
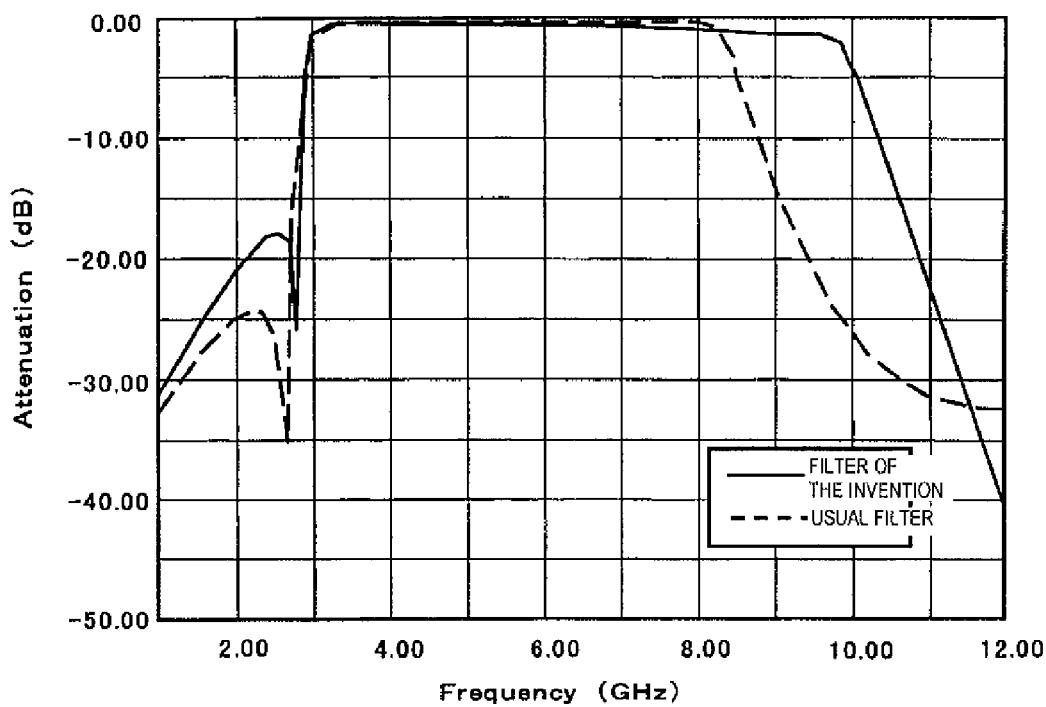
FIG. 7 is a graph showing pass characteristics of the stacked dielectric band-pass filters.

Next, operation and effects of the stacked dielectric band-pass filter of one embodiment are described. FIG. 4 is an equivalent circuit diagram of the stacked dielectric band-pass filter of the embodiment. FIG. 5 is an equivalent circuit diagram of a filter shown in a usual example (JP-A-2006-101500). FIG. 6 is a graph showing reflection characteristics of the filter of the embodiment and the filter of the usual example, and FIG. 7 is a graph showing pass characteristics of the filter of the embodiment and the filter of the usual example.

The stacked dielectric band-pass filter of the exemplary embodiment is different from the filter of the usual example in that resonators SL4 and SL5 are formed by adding the second $\lambda/4$ resonator electrodes 7a and 7b. The resonators SL4 and SL5 provide magnetic field coupling M. The resonators SL4 and SL5 providing the magnetic field coupling M are added, so that an attenuation peak A appears near 9 GHz as shown in FIG. 6. That is, the peak A due to the magnetic field coupling is added to a usual synthesized peak of peaks of a fundamental wave and a third harmonic wave given by the $\lambda/4$ resonator electrode, and a harmonic wave given by the $\lambda/2$ resonator electrode. Thus, as shown in FIG. 7, while a bandwidth is not higher than about 80 Hz in a usual pass characteristic, the bandwidth can be extended to 9.5 GHz in the exemplary embodiment.

Figure 8:
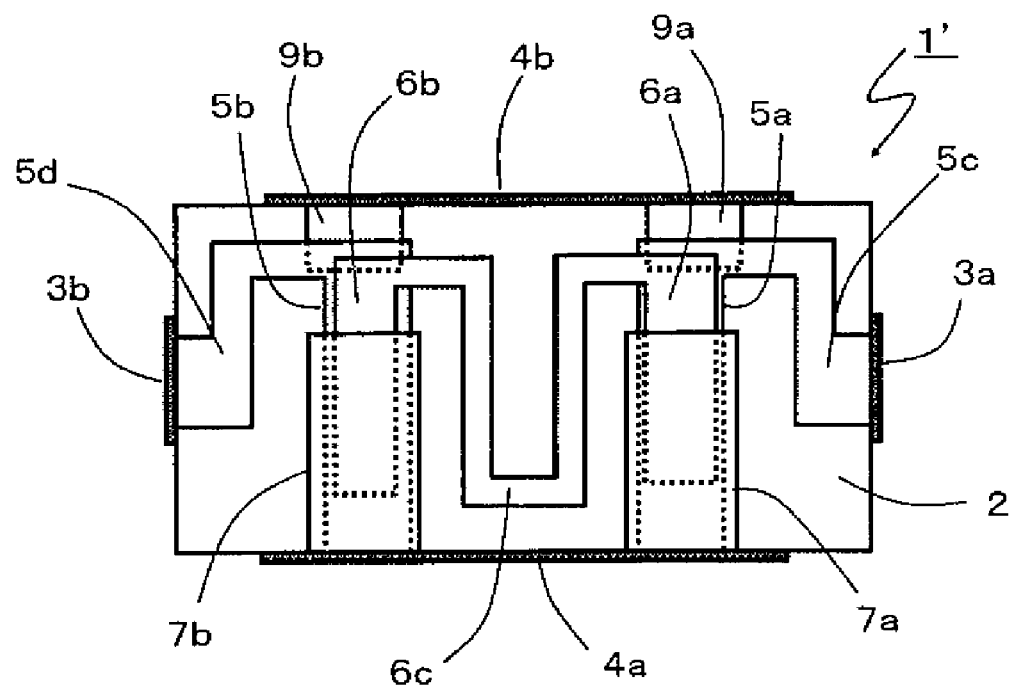
FIG. 8 is a plane perspective diagram of another example of the stacked dielectric band-pass filter of one embodiment.
Figure 9:
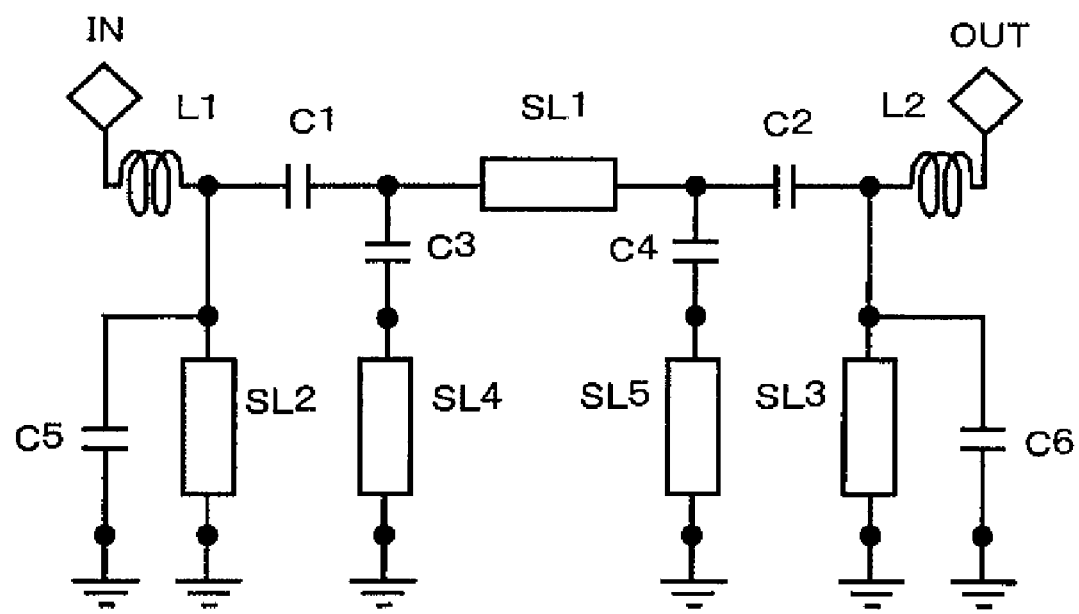
FIG. 9 is an equivalent circuit diagram of another example of the stacked dielectric band-pass filter of one embodiment.

Next, another example of the embodiment according to the stacked dielectric band-pass filter is shown in FIGS. 8 and 9. FIG. 8 is a plane perspective diagram, and FIG. 9 is an equivalent circuit diagram. The stacked dielectric band-pass filter 1' is added with a wavelength shortening electrode 9a facing the first $\lambda/4$ resonator electrode 5a via a dielectric, and a wavelength shortening electrode 9b facing the first $\lambda/4$ resonator electrode 5b via a dielectric. According to such a configuration, the $\lambda/4$ resonator electrodes 5a and 5b are shortened in wavelength so that the filter can be reduced in size.

While the embodiment of the invention has been described hereinbefore, the embodiment can be modified, for example, an order of stacking the first $\lambda/4$ resonator electrode and the second $\lambda/4$ resonator electrode may be changed. Moreover, while the embodiment was described with a filter used for a band of 3 to 10 GHz as an example, the filter is not limitedly used for such a band.

Since a filter is given, which is small in structure, and enables widening of a passband, the filter is expected to be used for a communication device required to be usable for an ultra wide band as in the UWB system.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. A stacked dielectric band-pass filter, comprising:
    a stacked dielectric block in an approximately rectangular shape,
    input terminals and output terminals formed on one pair of side faces opposed to each other of the stacked dielectric block, and
    ground terminals formed on the other pair of side faces opposed to each other of the stacked dielectric block;
    the stacked dielectric block further comprising:
        a pair of first $\lambda/4$ resonator electrodes that are formed on approximately the same plane, and connected to the input terminals or the output terminals via lead conductors respectively,
        two capacitance electrodes that are opposed to the first $\lambda/4$ resonator electrodes via a first dielectric layer respectively, and formed on approximately the same plane, and a $\lambda/2$ resonator electrode connecting the capacitance electrodes, and
        a pair of second $\lambda/4$ resonator electrodes that are opposed to the capacitance electrodes via a second dielectric layer respectively, formed on approximately the same plane, and buried in layers.

2. The stacked dielectric band-pass filter according to claim 1:
    wherein at least one ground electrode connected to the ground terminals is buried within the stacked dielectric block.

3. The stacked dielectric band-pass filter according to claim 2:
    wherein the ground electrode is formed near a side being a mounting face at a lower layer side with respect to the first $\lambda/4$ resonator electrodes, second $\lambda/4$ resonator electrodes, and $\lambda/2$ resonator electrode.

4. The stacked dielectric band-pass filter according to claim 3:
    wherein two ground electrodes are formed in a form of an upper layer and a lower layer so as to sandwich the first $\lambda/4$ resonator electrodes, second $\lambda/4$ resonator electrodes, and $\lambda/2$ resonator electrode.

5. The stacked dielectric band-pass filter according to claim 1, further comprising:
    wavelength shortening electrodes facing the first $\lambda/4$ resonator electrodes via a dielectric layer.

6. A stacked dielectric band-pass filter, comprising:
    a pair of first $\lambda/4$ resonator electrodes connected to input/output terminals;
    two capacitance electrodes facing the first $\lambda/4$ resonator electrodes via a first dielectric layer respectively and connected by a $\lambda/2$ resonator electrode; and
    a pair of second $\lambda/4$ resonator electrodes facing the capacitance electrodes via a second dielectric layer respectively, and formed on approximately the same plane.

7. The filter of claim 6, wherein the second $\lambda/4$ resonator electrodes have one end connected to ground terminals.

* * * * *

UNITED STATES PATENT AND TRADEMARK OFFICE
CERTIFICATE OF CORRECTION

| | |
|---|---|
| PATENT NO. | : 7,592,885 B2 |
| APPLICATION NO. | : 11/871350 |
| DATED | : September 22, 2009 |
| INVENTOR(S) | : Sekine et al. |

It is certified that error appears in the above-identified patent and that said Letters Patent is hereby corrected as shown below:

At Column 4, Line 4, please delete "5b" and insert therefore, --8b--.

At Column 4, Line 11, please delete "5b" and insert therefore, --8b--.

At Column 4, Line 43, please delete "80 Hz" and insert therefore, --8 GHz--.

Signed and Sealed this

Ninth Day of March, 2010

David J. Kappos
*Director of the United States Patent and Trademark Office*